US005917208A

United States Patent [19]
Hatano

[11] Patent Number: 5,917,208

[45] **Date of Patent: *Jun. 29, 1999**

[54] CHARGE COUPLED DEVICE AND ELECTRODE STRUCTURE

[75] Inventor: Keisuke Hatano, Tokyo, Japan

[73] Assignee: NEC Corporation, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/617,368

[22] Filed: Mar. 18, 1996

[30] Foreign Application Priority Data

Mar. 30, 1995 [JP] Japan .................................... 7-095858

[51] Int. Cl.[6] ......................... H01L 27/148; H01L 29/768

[52] U.S. Cl. .......................... 257/249; 257/221; 257/222; 257/233; 257/435

[58] Field of Search .................................... 257/233, 249, 257/250, 221, 222, 435

[56] References Cited

U.S. PATENT DOCUMENTS

| | | | |
|---|---|---|---|
| 3,865,652 | 2/1975 | Agusta et al. | 257/249 |
| 4,055,885 | 11/1977 | Takemoto | 257/250 |
| 4,064,524 | 12/1977 | Hagiwara et al. | 257/233 |
| 4,528,684 | 7/1985 | Iida et al. | 257/221 |
| 4,754,311 | 6/1988 | Davids et al. | 257/249 |
| 4,847,692 | 7/1989 | Tabei | 257/249 |
| 5,210,433 | 5/1993 | Ohsawa et al. | 257/250 |
| 5,256,890 | 10/1993 | Furukawa et al. | 257/249 |

OTHER PUBLICATIONS

"A Low Driving Voltage CCD with Single Layer Electrode Structure for Area Image Sensor", IEDM Tech. Dig., pp. 705–708, 1994.

*Primary Examiner*—Gene M. Munson
*Attorney, Agent, or Firm*—Laff, Whitesel, Conte & Saret, Ltd.

[57] ABSTRACT

In a method of manufacturing a charge coupled device, a channel layer is formed on a surface of a semiconductor substrate. Then, first layer transfer electrodes are formed in a charge transfer direction above the channel layer via a first insulating film. Subsequently, second layer transfer electrodes are formed such that each of the second layer transfer electrodes is disposed between two of the first layer transfer electrodes without any portion overlapping the first layer transfer electrodes in a plane structure. The second layer transfer electrodes may be patterned after a polysilicon film is deposited and polished or may be polished after the polysilicon film is deposited and patterned.

5 Claims, 8 Drawing Sheets

CHARGE COUPLED DEVICE AND ELECTRODE STRUCTURE

BACKGROUND OF THE INVENTION

1. Field of the Invention

The present invention relates to a charge coupled device (CCD) and a method for manufacturing the same, and more particularly, to a CCD having a small coupling capacitance between transfer electrodes which CCD is used in an area solid image pick-up element, linear solid state image pick-up element, memory and delay element, and a method for manufacturing the CCD.

2. Description of Related Art

In a solid state image pick-up device, high speed charge transfer is recently required as the pixel density is increased. In order to achieve such high speed charge transfer, it is extremely importance to reduce a coupling capacitance between transfer electrodes.

FIG. 1A is a plan view of an area solid image pick-up element using a conventional CCD and FIG. 1B is a cross sectional view of the image pick-up element cut along the line B—B'. Transfer electrodes are usually formed using two or three layers of polysilicon film. In this example, two layers of polysilicon film are used. In FIG. 1A, a photo-electric converting section 110 generates electric charges in accordance with incident light and stores them. A buried channel layer 102 is provided under a first layer transfer electrode 105 of polysilicon film and a second layer transfer electrode 106 of polysilicon film. The charges stored in the photo-electric converting section 110 are read out into the channel layer 102 under the second layer transfer electrode 106 by applying a high voltage of 10 V or more to the second layer transfer electrode 106 for every predetermined time period. Then, the read out charges are transferred downward in FIG. 1A by applying transfer pulses to the transfer electrodes 105 and 106.

As shown in FIG. 1B, the buried channel layer 102 is formed in a predetermined region on a P-type silicon substrate 101. N-type impurity is doped into the buried channel layer 102. The buried channel layer 102 is widely used in CCD registers. The first layer transfer electrodes 105 are arranged with a predetermined pitch via a gate oxide film 104 on the surface of the semiconductor substrate 101 in which the buried channel layer 102 has been formed. The second layer transfer electrodes 106 are each arranged between the first layer transfer electrodes 105. In order to prevent the decrease of transfer efficiency, it is necessary to provide the transfer electrodes very closely to each other. However, for reason of the manufacturing precision, the second layer transfer electrode 106 is provided to override on the first layer transfer electrode 105 at the end portion.

In the above-mentioned conventional example, since two layers of polysilicon electrodes are formed in such a manner that the two layers overlap at the end portion, a coupling capacitance is great between the first layer transfer electrode 105 and the second layer transfer electrode 106. If the coupling capacitance is great, power consumption increases. At the same time, the load of a driver for driving the device is heavy, so that it is difficult to drive the device at a high speed. Further, there is a large step at the overlapping portion of the first layer transfer electrode 105 and the second layer transfer electrode 106. For this reason, processing to the step portion is difficult in the photolithography process so that the processing precision is further decreased. In addition, in a case where the device is used for the solid state image pick-up device, light leaks into the channel layer of the CCD from the gap produced due to the step portion under a light shielding film, the smear characteristic is degraded.

For solving the above-mentioned problems, a method is proposed in which one layer polysilicon electrode material is etched using a resist mask to form a pattern of transfer electrodes which are repeatedly arranged with a narrow space, as shown in "A Low Driving Voltage CCD with Single Layer Electrode Structure for Area Image Sensor" (IEDM Tech. Dig., pp. 705–708, 1994). The gap between the transfer electrodes is required to be 0.2 $\mu$m or below for transferring charges between the CCD registers with an efficiency close to 100%. However, it is difficult to dispose the gap with such a precision by lithography technique currently used for mass-production.

SUMMARY OF THE INVENTION

The present invention has, as an object, to provide a charge coupled device (CCD) and method for manufacturing the same in which the CCD has a small coupling capacitance between transfer electrodes for high speed charge transfer.

Another object of the present invention is to provide a CCD and method for manufacturing the same in which a multilayer electrode structure with less step can be easily formed.

In order to achieve an aspect of the present invention, a charge coupled device for transferring electric charges, includes first layer transfer electrodes provided in a charge transfer direction above a channel layer which is provided on a surface of a semiconductor substrate, and second layer transfer electrodes each provided between two of the first layer transfer electrodes without any portion overlapping the first layer transfer electrodes in a plane structure.

The charge coupled device may further includes an electrically conductive film disposed above the first and second transfer electrodes via an insulating film such that the conductive film covers the first and second layer transfer electrodes. In this case, the second layer transfer electrodes are formed in an island manner and the conductive film has contacts with the second layer transfer electrodes. The conductive film is preferably formed of a material for shielding light incident to the channel layer. If the charge coupled device further includes two electrically conductive films disposed above the first and second layer transfer electrodes via an insulating film, one of every two of the second layer transfer electrodes is connected to one of the two conductive films and the other second layer transfer electrodes are connected to the other of the two conductive films. Further, the charge coupled device may further includes a barrier layer formed on the channel layer surface in self-alignment with two of the first layer transfer electrodes.

In order to achieve another aspect of the present invention, a method of manufacturing a charge coupled device comprising the steps of:

- forming a channel layer on a surface of a semiconductor substrate;
- forming first layer transfer electrodes in a charge transfer direction above the channel layer via a first insulating film; and
- forming second layer transfer electrodes such that each of the second layer transfer electrodes is disposed between two of the first layer transfer electrodes without any portion overlapping the first layer transfer electrodes in a plane structure. The second layer transfer electrodes may be patterned after a polysilicon film is deposited and polished or may be polished after the polysilicon film is deposited and patterned.

In order to achieve still another aspect of the present invention, a charge coupled device for transferring electric charges, includes a plurality of channel layers which are provided on a surface of a semiconductor substrate in a charge transfer direction, first layer transfer electrodes provided in a matrix manner on the plurality of channel layers, and second layer transfer electrodes each provided between two of the first layer transfer electrodes in a column direction as the charge transfer direction without any portion overlapping the first layer transfer electrodes in a plane structure.

DESCRIPTION OF THE PREFERRED EMBODIMENTS

The charge transfer structure in a charge coupled device (CCD) which is used in a solid state image pick-up device, according to the present invention will be described below in detail with reference to the accompanying drawings.

Figure 1A:
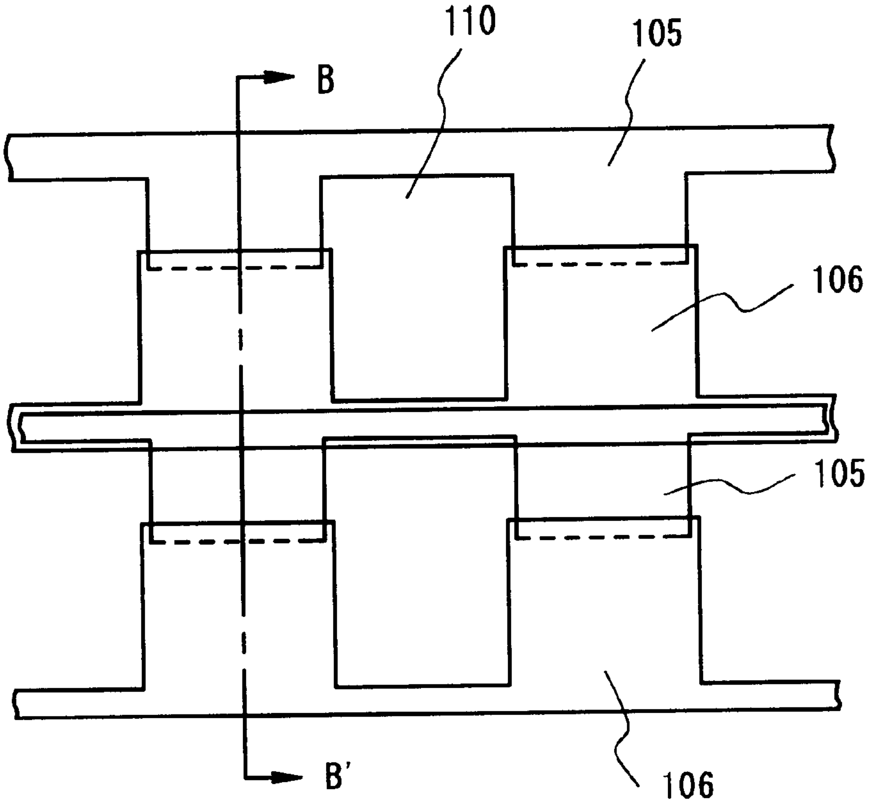
FIG. 1A is a plan view of a charge transfer structure of a conventional charge coupled device (CCD)
Figure 1B:
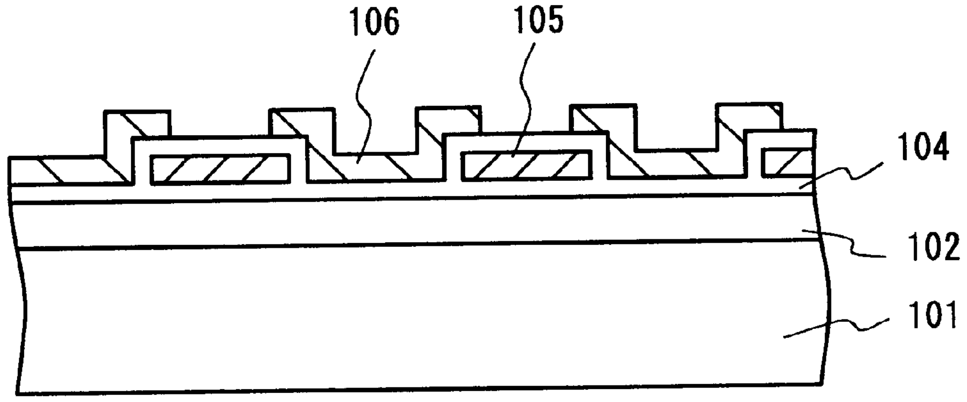
FIG. 1B is a cross sectional view of the charge transfer structure shown in FIG. 1A.
Figure 2A:
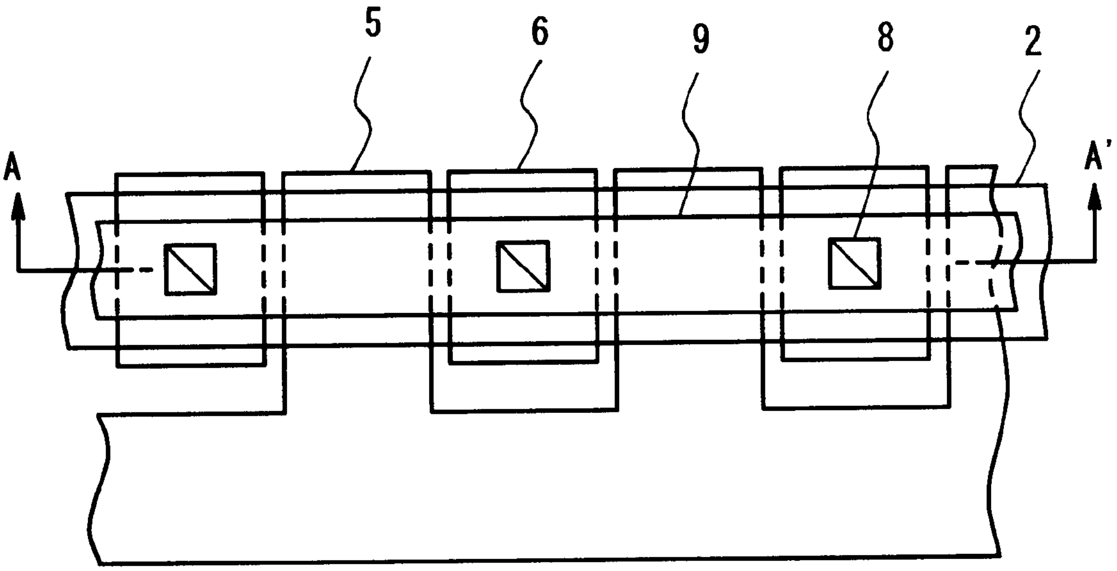
FIG. 2A is a plan view of the charge transfer structure of a CCD according to a first embodiment of the present invention.
Figure 2B:
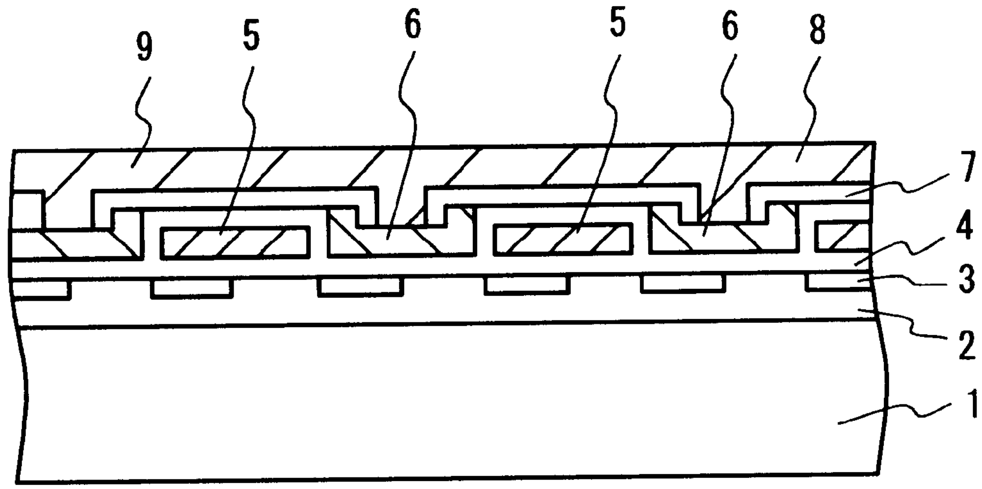
FIG. 2B is a cross section view of the charge transfer structure of the CCD shown in FIG. 2A.

FIG. 2A is a plan view of the CCD to which the solid state image pick-up device according to the first embodiment of the present invention is applied. FIG. 2B is a cross sectional view of the CCD shown in FIG. 2A cut along the line A—A'. As shown in FIG. 2B, an N-type buried channel layer 2 is provided on a P-type semiconductor (silicon) substrate 1 and has barrier layers 3 formed by impurity doping of boron (B) in an island manner at the surface region. A first layer transfer electrode 5 and second layer transfer electrode 6 of polysilicon are formed via a gate oxide film 4 alternately in a surface plane on the P-type silicon substrate 1 which containing the channel layer 2. The second layer transfer electrode 6 is formed in the recession section between the first layer transfer electrodes 5 via the gate oxide film 4 on the substrate 1 to have a U-shape. Therefore, the second layer transfer electrode 6 has no portion overlapping or overlaying on the first layer electrode 5. A pulse transmission line 9 of aluminum is formed on the first and second layer transfer electrodes 5 and 6 via an inter-layer insulating film 7. The pulse transmission line 9 is connected to the second layer transfer electrodes 6 via contacts 8. The first layer transfer electrodes 5 are connected to a common pattern in the lower portion of the FIG. 2A. The first layer and second layer transfer electrodes 5 and 6 are supplied with transfer pulses having two phases inverse to each other.

Next, the manufacturing method of the CCD according to the first embodiment of the present invention will be described with reference to FIGS. 3A to 3C.

Figure 3A:
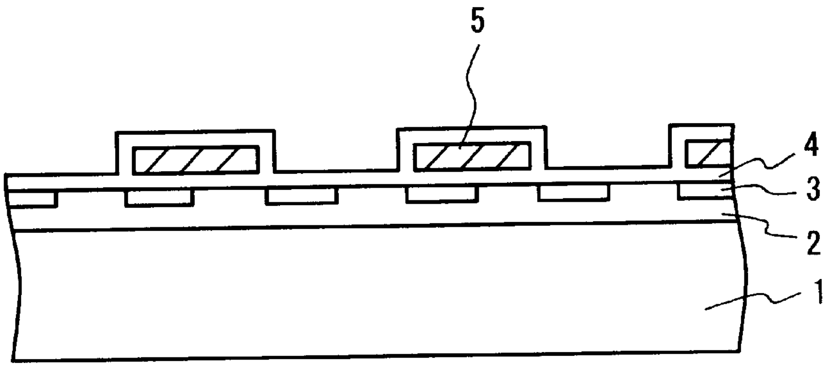
FIGS. 3A to 3C are cross sectional view of the charge transfer structure of the CCD shown in FIG. 2A in the manufacturing process.

First, referring to FIG. 3A, the N-type buried channel layer 2 is formed on the P-type silicon substrate 1 and then the barrier layers 3 are formed on the surface of channel layer 2 using photolithography technique and ion implantation method. Subsequently, the gate oxide film 4 is formed on the silicon substrate 1 using a thermal oxidization method and then a polysilicon film is deposited on the gate oxide film 4. The polysilicon film is patterned using photolithography technique and a reactive ion etching (RIE) method to form the first layer transfer electrodes 5. Subsequently, an oxide film is formed by applying a thermal oxidization method to the substrate 1 in which the first layer transfer electrodes 5 have been formed.

Figure 3B:
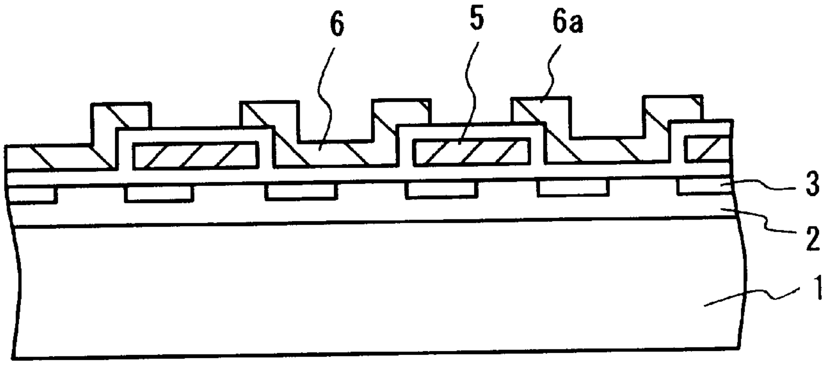

Next, referring to FIG. 3B, a polysilicon film is formed deposited over the surface of substrate 1. The polysilicon film is patterned to form the second layer transfer electrodes 6, as in the formation of the first layer transfer electrodes 5. In this state, a portion of the second layer transfer electrode 6 overlaps the first layer transfer electrodes 5 via the oxide film formed through the thermal oxidization process.

Figure 3C:
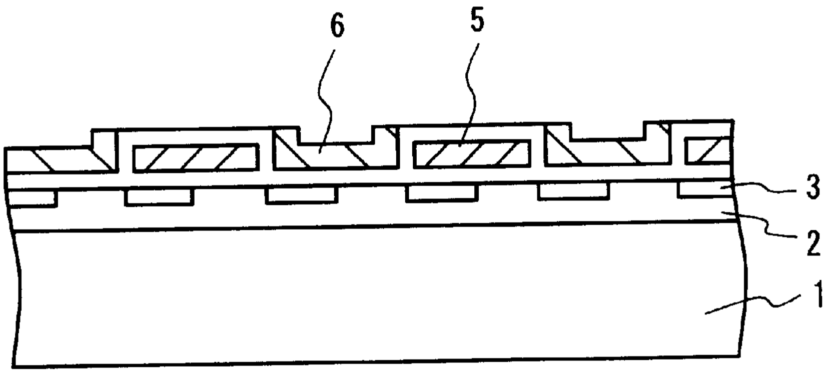

Next, referring to FIG. 3C, the second layer transfer electrodes 6 is subjected to a chemical mechanical polishing (CMP) method such that the overlapping portions of each of the second layer transfer electrode 6 are removed. In this case, the CMP method may be performed until the oxide films on the first layer transfer electrodes 5 appear. Thus, the overlapping portions of the second layer transfer electrodes 6 are selectively removed. As a result, the electrode structure can be obtained to have no overlapping or overlaying portion, as shown in FIG. 3C.

Next, the interlayer insulating film 7 is deposited over the entire surface. Then, openings are formed in the interlayer insulating film 7 for contacts with the second layer transfer electrodes 6. Thereafter, aluminum is deposited over the entire surface by a sputtering method and the aluminum layer is patterned for the pulse transmission layer 9. In this manner, the CCD shown in FIGS. 2A and 2B can be obtained.

Figure 4:
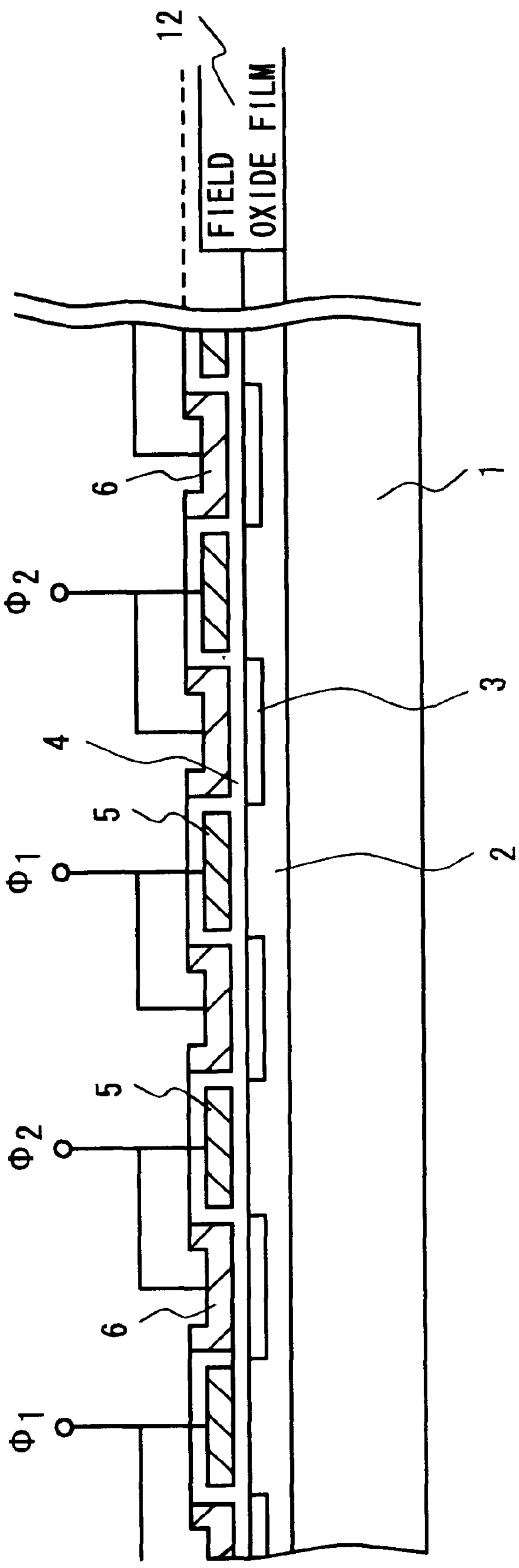
FIG. 4 is a diagram illustrating the state in which clock pulses are supplied to the CCD shown in FIG. 2A.

Next, the CCD according to the second embodiment of the present invention will be described with reference to FIG. 4. The CCD in the second embodiment is basically the same as that in the first embodiment. The second embodiment is different from the first embodiment in that a barrier layer 3 is formed entirely under the second layer transfer electrode 6. In this embodiment, adjacent first and second layer transfer electrodes 5 and 6 are externally connected to construct one transfer electrode.

For the CCD in the second embodiment, after the first layer transfer electrode 5 is formed, ion implantation of boron is performed using the first layer transfer electrodes 5 as a mask to form the barrier layer 3. Thereafter, the second layer transfer electrode 6 is formed and the overlapping portions of the second layer transfer electrodes 6 on the first layer transfer electrodes 5 are removed by the CMP method like the first embodiment.

According to the second embodiment, since the barrier layer 3 can be formed in self-alignment manner with the transfer electrodes, the transfer efficiency can be increased compared to the first embodiment.

Next, the CCD according to the third embodiment of the present invention will be described with reference to FIGS. 5A, 5B and 6. In the third embodiment, the present invention is applied to a CCD register of a solid state image pick-up device.

Figure 5A:
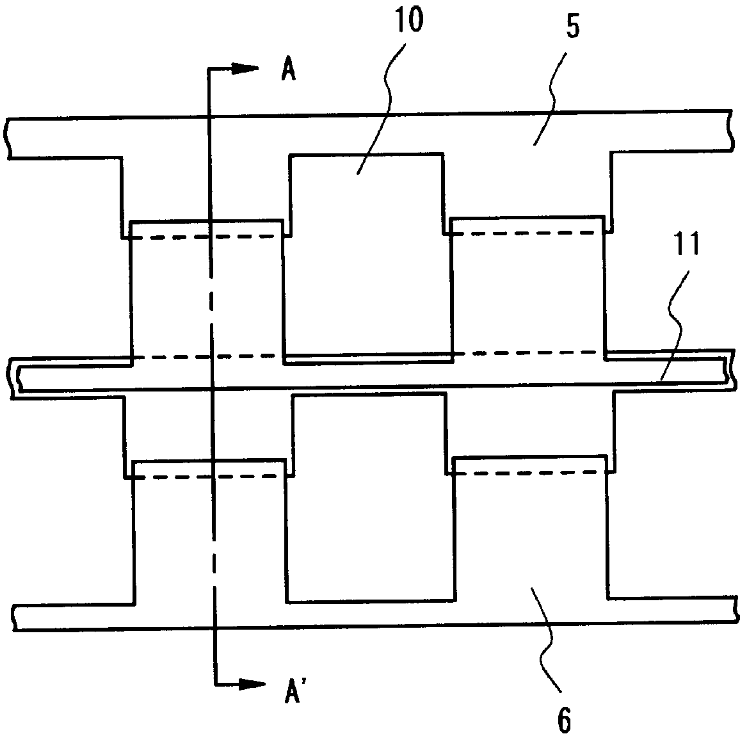
FIGS. 5A and 5B are plan views of the charge transfer structure of a CCD according to a second embodiment of the present invention in the manufacturing process.
Figure 6:
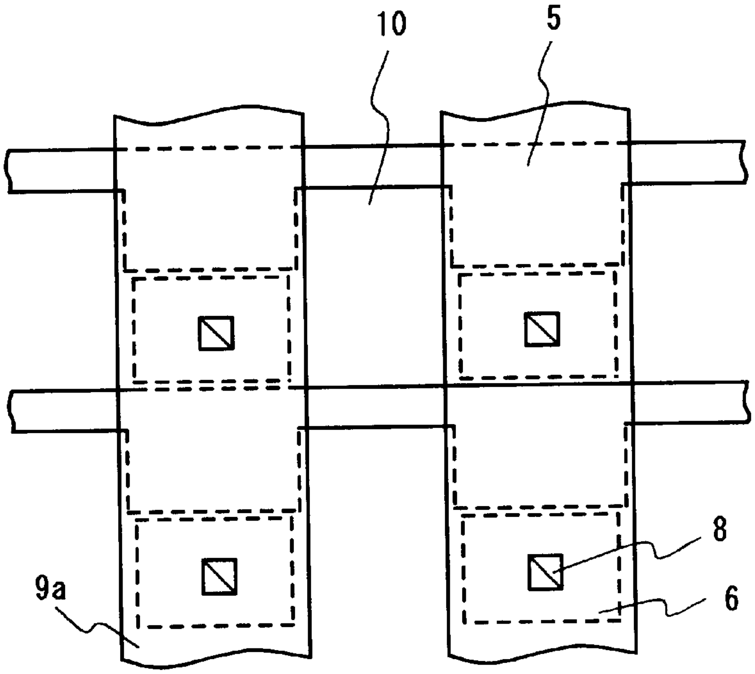
FIG. 6 is a plan view of the charge transfer structure of a CCD according to a third embodiment of the present invention.

FIG. 5A shows the state in which the first and second layer transfer electrodes 5 and 6 are formed on the semiconductor substrate in which the photo-electric converting section 10 and the buried channel layer (not shown) have been formed. A cross sectional view of the CCD register cut along the line A—A' in this state is the same as shown in FIG. 3A. In the plan view of FIG. 5A, the second layer transfer electrode 6 is formed such that it completely overlapping the first layer transfer electrode 5 in a transfer section 11.

Figure 5B:
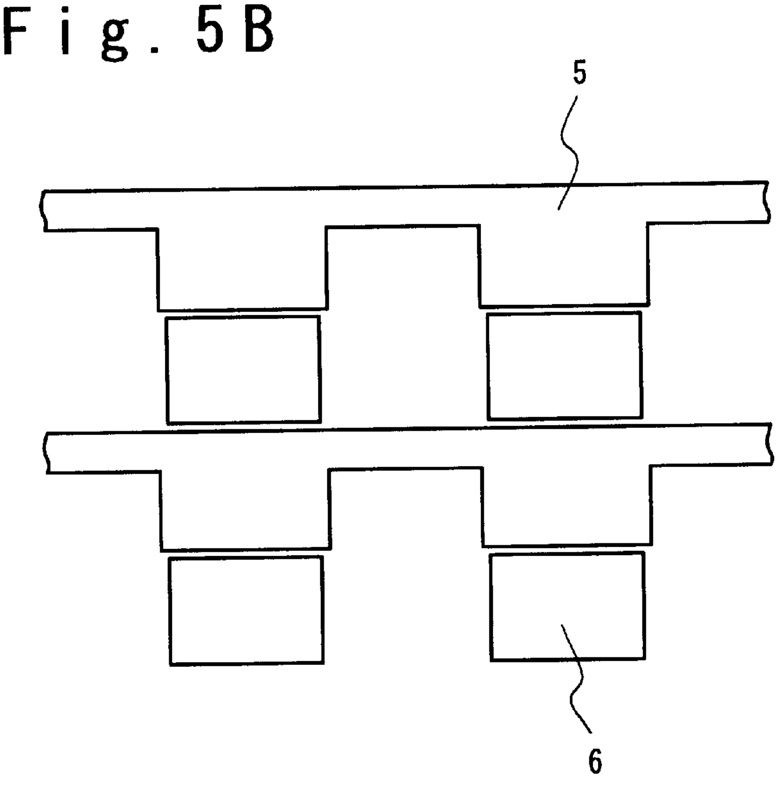

Next, the overlapping portion of the second layer transfer electrode 6 on the first layer transfer electrode 5 is selectively removed by the CMP method, as shown in FIG. 5B. Through this step, the electrode structure having no overlapping portion between the transfer electrodes can be obtained. In this case, the second layer transfer electrodes 6 are formed in an island manner with respect to the first layer transfer electrodes 5 in a plan view. The cross sectional view of the third embodiment is the same as that shown in FIG. 3C.

Next, after the interlayer insulating film 7 is deposited, the contact holes 8 for are formed in the interlayer insulating film 7. Then, a film of metal such as tungsten (W) is deposited and patterned. As a result, the pulse transmission line 9*a* is formed which also functions as a light shielding film covering the channel layer 3, as shown in FIG. 6. In the process of forming of the pulse transmission line 9*a* functioning as the light shielding film, since the metal film of tungsten is formed on the semiconductor substrate having less step between layers, the process can be easily performed. Further, a gap between the light shielding film and the semiconductor substrate can be decreased, the amount of light incident to the channel layer can be decreased, so that the smear characteristic can be improved.

In removing the second layer transfer electrode 6 overlapping the first layer transfer electrode 5 by the CMP method, if the top surface of the field oxidation film (not shown) at the peripheral section is higher than the surface of the semiconductor substrate 1 in the regions of the photo-electric converting section 10 and buried channel layer, a polishing pad cannot contact uniformly so that an unpolished region will be remained. Therefore, it is preferable that after the surface layer of 0.3 to 0.5 $\mu$m is removed from the silicon semiconductor substrate 1, the field oxidation film is formed there, so that the height of field oxidation film is lower than that the height of transfer electrode.

Figure 7:
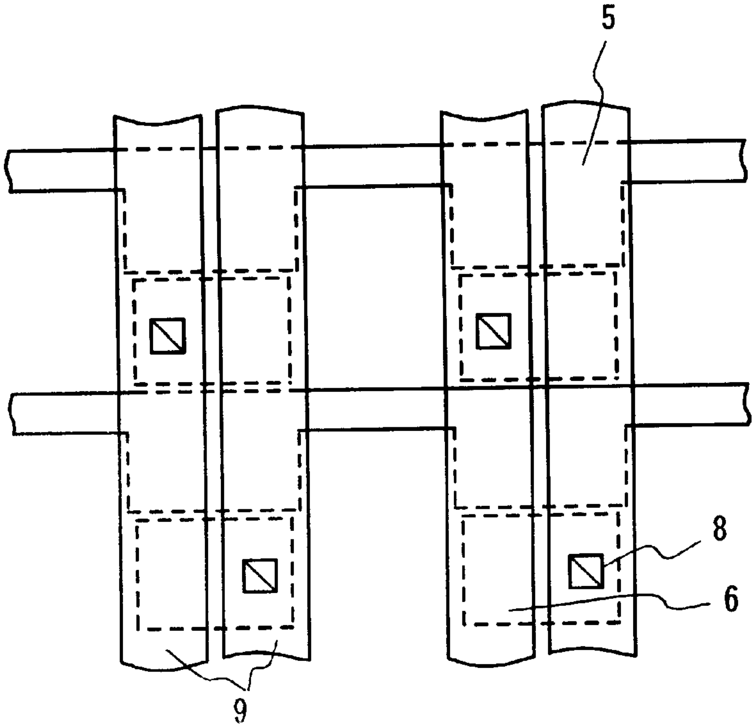
FIG. 7 is a plan view of the charge transfer structure of a CCD according to a fourth embodiment of the present invention.

Next, the solid state image pick-up device according to the fourth embodiment of the present invention will be described with reference to FIG. 7. The fourth embodiment is basically the same as the third embodiment shown in FIG. 6.

The fourth embodiment is different from the third embodiment in that two pulse transmission lines 9 extend above the buried channel layer and the second layer transfer electrodes 6 are connected to one of the two pulse transmission lines 9 for every two and to the other for remaining electrode. Further, in this embodiment, no barrier layer is formed in the buried channel layer. Thus, in the CCD register in the fourth embodiment, charge transfer can be carried out by a four-phase driving system.

Figure 8A:
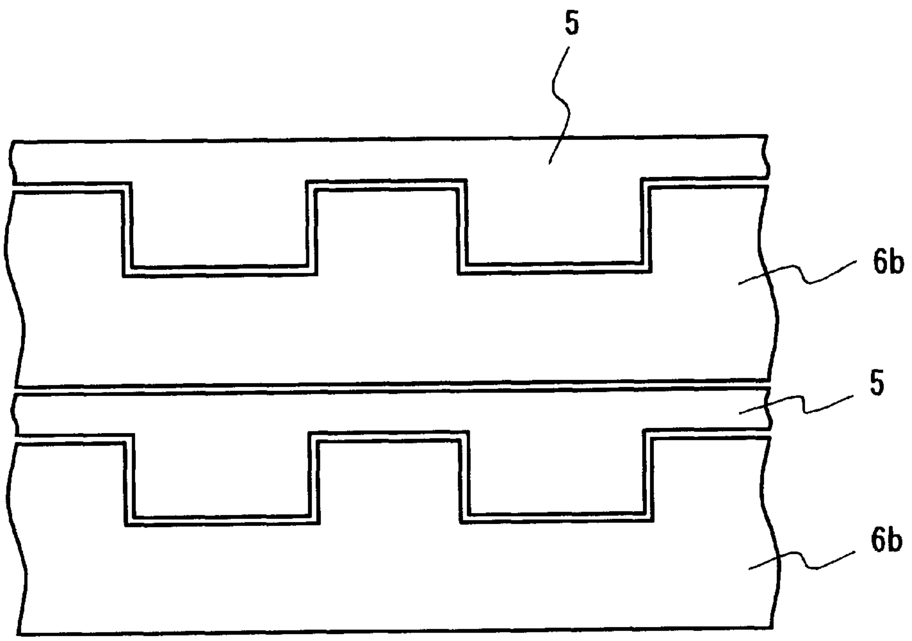
FIGS. 8A and 8B are plan views of the charge transfer structure of a CCD according to a fifth embodiment of the present invention in the manufacturing process.
Figure 8B:
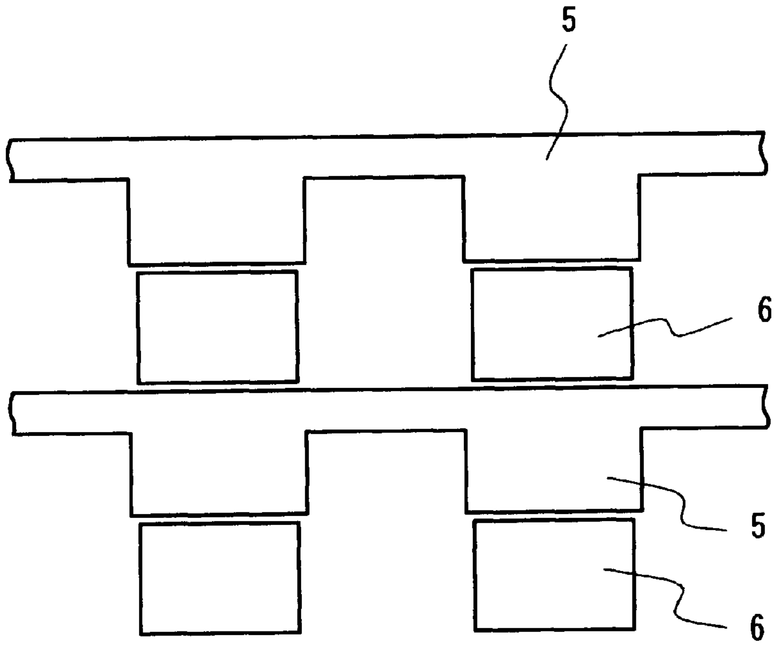

Next, a method of manufacturing the solid state image pick-up device according to the fifth embodiment of the present invention will be described with reference to FIGS. 8A and 8B. The processes until the first layer transfer electrode 5 is formed are the same as those in the third embodiment shown in FIG. 5A. Therefore, the description will be omitted. In the fifth embodiment, after the first layer transfer electrodes 5 are formed and covered by the insulating film which is formed through the thermal oxidization method or the like, a polysilicon film is deposited on the surface of substrate as the second layer transfer electrode forming material. Thereafter, the overlapping portions of the polysilicon film on the first layer transfer electrodes 5 are removed by the CMP method. As a result, the polysilicon films 6*b* are remained in a region where the first layer transfer electrodes 5 do not exist, as shown in FIG. 8A. Subsequently, the remained polysilicon films 6*b* are patterned to form the second layer transfer electrodes 6 as shown in FIG. 8B. The plane structure shown in FIG. 8B is the same as that in the third embodiment and therefore the same subsequent processes as in the third or fourth embodiment are performed.

According to the fifth embodiment, since the overlapping portions of the polysilicon films 6*b* for second layer transfer electrodes 6 are removed by the CMP method by the time when the polysilicon films 6*b* are patterned, the patterning process can be easily performed.

Figure 9A:
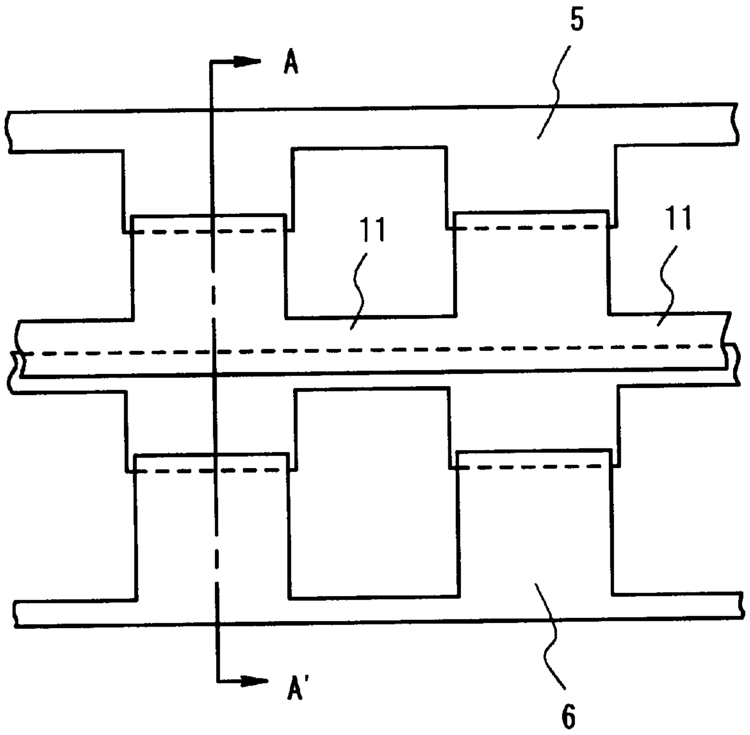
FIGS. 9A and 9B are plan views of the charge transfer structure of a CCD according to a sixth embodiment of the present invention in the manufacturing process.
Figure 9B:
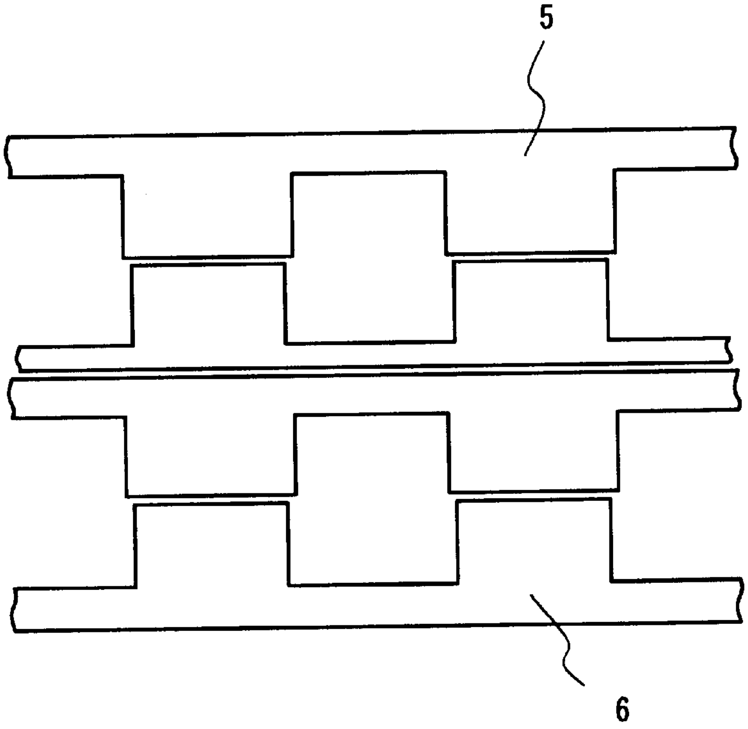

Next, the solid state image pick-up device according to the sixth embodiment of the present invention will be described with reference to FIGS. 9A and 9B. In the sixth embodiment, the cross sectional view of the solid state image pick-up device cut along the line A—A' is the same as that in the first embodiment shown in FIG. 3A. As shown in FIG. 9A, the second layer transfer electrode 6 is formed such that a portion of the transfer electrode 6 overlaps the first layer transfer electrode 5. Subsequently, the overlapping portions of the second layer transfer electrodes 6 are selectively removed by the CMP method, as in the other embodiments, so that the plane structure shown in FIG. 9B can be obtained.

According to the sixth embodiment, the second layer transfer electrodes 6 are formed not to be in an island manner but to be connected to a common pattern in a row direction. Therefore, contacts between the pulse transmission line and the second layer transfer electrodes are not required, resulting in simplifying the manufacturing process. Further, the degree of freedom can be increased in selecting a clock for the charge transfer.

As described above, according to the charge coupled device of the present invention, because the overlapping portion between the first layer transfer electrode and the second layer transfer electrode is removed, the coupling capacitance between the first layer transfer electrode and the second layer transfer electrode can be reduced. Therefore, power consumption can be decreased. The high speed charge transfer can be also achieved which is required for high pixel density. Further, according to the present invention, because the number of steps and the height of step can be reduced on the semiconductor device surface, the photolithography process can be easily performed, resulting in a high precision. In addition, when the present invention is applied to the solid state image pick-up device, the amount of light incident to the channel layer is decreased so that the smear characteristic can be improved.

What is claimed is:

1. A charge coupled device for transferring electric charges, said device comprising:

a plurality of channel layers which are provided on a surface of a semiconductor substrate in a charge transfer direction;

first layer transfer electrodes provided above said plurality of channel layers, a first insulating film provided on said first layer transfer electrodes;

second layer transfer electrodes each provided between two of said layer transfer electrodes in the charge transfer direction via a second insulating film with a controllable film thickness and without any portion overlapping said first layer transfer electrodes in a plane structure, said first insulating film and a top part of said second layer transfer electrodes having a same height; and an electrically conductive film disposed for each channel layer above said first and second layer transfer electrodes via a third insulating film in the charge transfer direction such that said conductive film covers said first and second layer transfer electrodes, wherein said second layer transfer electrodes are formed in an island manner and wherein said conductive film has contacts with said second layer transfer electrodes.

2. A charge coupled device according to claim 1, wherein said conductive films are formed of a material for shielding light incident to said channel layer.

3. A charge coupled device for transferring electric charges, said device comprising:

a plurality of channel layers which are provided on a surface of a semiconductor substrate in a charge transfer direction;

first layer transfer electrodes provided above said plurality of channel layers, a first insulating film being provided on said first layer transfer electrodes;

second layer transfer electrodes provided between two of said layer transfer electrodes in the charge transfer direction via a second insulating film with a controllable film thickness and without any portion overlapping said first layer transfer electrodes in a plane structure, said first insulating film and a top part of said second layer transfer electrodes having a same height; and two electrically conductive films disposed for each channel layer above said first and second layer transfer electrodes via an insulating film such that one of every two of said second layer transfer electrodes is connected to one of said two conductive films and the other second layer transfer electrodes are connected to the other of said two conductive films.

4. A charge coupled device according to claim 3, further comprising a barrier layer formed on said channel layer surface in self-alignment with two of said first layer transfer electrodes.

5. A charge coupled device according to claim 3, wherein ones of said first layer transfer electrodes which located on a corresponding position in the column direction are connected to a common pattern extending in a row direction.

* * * * *